US006977605B2

(12) United States Patent
Lee et al.

(10) Patent No.: US 6,977,605 B2
(45) Date of Patent: Dec. 20, 2005

(54) DUMMY DELAY LINE BASED DLL AND METHOD FOR CLOCKING IN PIPELINE ADC

(75) Inventors: Chun Chieh Lee, Ann Arbor, MI (US); Visvesvaraya A. Pentakota, Bangalore (IN); Vineet Mishra, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/887,969

(22) Filed: Jul. 9, 2004

(65) Prior Publication Data

US 2005/0110671 A1 May 26, 2005

Related U.S. Application Data

(60) Provisional application No. 60/525,282, filed on Nov. 26, 2003.

(51) Int. Cl.[7] .......... H03M 1/38
(52) U.S. Cl. .......... 341/161; 327/149
(58) Field of Search .......... 341/118, 120, 155–172; 327/147, 149, 156–158

(56) References Cited

U.S. PATENT DOCUMENTS

| | | | | |
|---|---|---|---|---|
| 5,541,602 | A * | 7/1996 | Opris et al. | 341/161 |
| 5,926,046 | A * | 7/1999 | Uchida | 327/158 |
| 6,400,301 | B1 | 6/2002 | Kulhalli et al. | 341/155 |
| 6,642,761 | B1 * | 11/2003 | Tien | 327/158 |
| 6,664,831 | B2 * | 12/2003 | Gauthier et al. | 327/159 |
| 6,680,634 | B1 * | 1/2004 | Ruha et al. | 327/158 |
| 6,801,146 | B2 * | 10/2004 | Kernahan et al. | 341/122 |
| 6,816,102 | B2 * | 11/2004 | Pavicic | 341/155 |
| 6,842,399 | B2 * | 1/2005 | Harrison | 365/233 |
| 6,859,078 | B2 * | 2/2005 | Choi | 327/149 |

OTHER PUBLICATIONS

"A Novel Analog Mirror Type DLL Suitable for Low Voltage Operation with Self-Calibration Method" by Akita et al., Microelctronics Engineering Laboratory, Semiconductor Company, Toshiba Corp., Japan, 2 pages, no date.

* cited by examiner

*Primary Examiner*—Linh V. Nguyen
(74) *Attorney, Agent, or Firm*—W. Daniel Swayze, Jr.; W. James Brady; Frederick J. Telecky, Jr.

(57) ABSTRACT

A delay locked loop clock generation circuit (100) includes a delay locked loop circuit (18), a dummy delay line (40), and a watch dog circuit (32). The delay locked loop circuit includes a delay line (20), a phase detector (25), and a charge pump circuit (30) having an input connected to the output (27) of the phase detector and an output (23) producing a delay control signal (Vctrl) coupled to the stages of the delay line of the delay locked loop circuit. The stages of the delay line are precisely matched to those of the dummy delay line (40). Tap points of the dummy delay line are connected to inputs of the watchdog circuit (32), which operates to generate control signals (34A,B) applied to control the phase detector (25 and the charge pump circuit (30). Tap point signals of the delay line (20) are decoded to produce clock signals (52) for a pipeline ADC (54).

17 Claims, 3 Drawing Sheets

DUMMY DELAY LINE BASED DLL AND METHOD FOR CLOCKING IN PIPELINE ADC

CROSS REFERENCE TO RELATED APPLICATION

This application claims the benefit of prior filed co-pending U. S. provisional application Ser. No. 60/525,282 filed Nov. 26, 2003 entitled "DUMMY DELAY LINE BASED DLL AND METHOD FOR CLOCKING IN PIPELINE ADC" by Chieh et al.

BACKGROUND OF THE INVENTION

The present invention relates generally to improvements in clock generation circuitry for pipeline analog-to-digital converters (ADCs), and more specifically to improvements for reducing the amount of switching noise in delay lines of delay locked loop (DLL) circuits in such clock generation circuitry and to provide additional available tap points in the DLL circuits.

FIG. 1 is a diagram of a prior art pipeline ADC which typically is clocked by the conventional clock generation circuitry of FIG. 2. The prior art pipeline ADC includes a sample and hold amplifier (SHA) which receives an analog input I/P. The output of the SHA is connected to the input of a pipeline stage 1, the output of which is connected to the input of a pipeline stage 2, and so forth for the remaining stages of the pipeline ADC. The SHA and pipeline stages 1, 2, etc. are clocked by a main clock signal CLK which is routed from the last stage, in the direction opposite to the signal, to the first stage, and the gain stages of each of pipeline stages 1, 2 etc. are clocked by sample signals S and SP and by hold signal H. The gain stages typically include two-stage Miller-compensated amplifiers. Commonly assigned U.S. patent U.S. Pat. No. 6,400,301 entitled "AMPLIFYING SIGNALS IN SWITCHED CAPACITOR ENVIRONMENTS", issued Jun. 4, 2002 to Kulhalli et al., entirely incorporated herein by reference, illustrates such a two-stage Miller-compensated amplifier FIG. 2 shows a conventional clock generator circuit for generating the signals S and H used for clocking a conventional pipeline ADC. (An additional sample signal SP having a slightly different transition time than the sample signal S and an additional hold signal HP having a slightly different transition time than the hold signal H are also typically used.) The conventional clock generator circuit of FIG. 2 receives a main clock signal such as CLK coupled to one input of a NAND circuit 10 and an input of an inverting delay circuit 11. A suitable number of inverting delay circuits such as 12 and 13 are connected in sequence to the output of a NAND circuit 10 to produce the hold signal H, which is fed back to one input of another NAND circuit 14. The output of inverting delay circuit 11 is connected to another input of NAND circuit 14. A suitable number of inverting delay circuits such as 15 and 16 are sequentially connected to the output of NAND circuit 14 to produce the sample signal S, which is fed back to another input of NAND circuit 10. This conventional clock generator circuit suffers from process, voltage, and temperature (PVT) variations and mismatches, which makes it difficult to maintain a sufficient amount of "non-overlap time" between the sample time and hold time, wherein the non-overlap time is the total amount of time available for the pipeline ADC to perform its sample and hold operations (during which the sample signal S and the hold signal H, respectively, are high). The timing diagram of FIG. 3 shows the CLK signal, the sampling signals S and SP, and the hold signal H typically applied to the even stages and odd stages of the pipeline ADC shown in FIG. 1.

The known clocking schemes such as one shown in FIG. 2 have included the use of delay circuits for producing non-overlapping clock signals, but unfortunately the delays produced by such delay circuits have very large PVT (process, voltage and temperature) variations which have resulted in reduced total sample times or hold times, thus providing less time for the switched capacitor amplifiers in the pipeline ADC stages to settle.

A very large amount of switching noise is produced in single delay lines of conventional delay locked loop (DLL) circuits. The delay line of a DLL is simply a chain of a typically large number of delay cells that switch continuously. The continuous switching injects noise (also referred to as "substrate noise") into the integrated circuit chip substrate. Such substrate noise may adversely affect the performance of other circuitry on the same chip.

Furthermore, some of the tap points of the single delay lines of conventional DLL circuits are connected to "watch dog circuits" which perform the functions of detecting "harmonic lock" or "stuck state" conditions in order to ensure proper working of the DLL loop circuitry. The tap points connected to the watch dog circuits are not available to be also connected to the clock generation circuitry, because in order to ensure matched delays at the output of the DLL, the loading at each output needs to matched, whereas connecting the tap points to inputs of the watch dog circuit results in introducing additional loading that prevents the needed matching. The above mentioned tapping used by watch dog circuits has required the use of cumbersome load matching circuitry to ensure the matched delays in the conventional DLL circuits.

The performance of the above described prior art integrated circuit pipeline ADCs and DLL circuitry have been subject to very large process, voltage, and temperature (PVT) variations.

Thus, there is an unmet need for improved DLL circuitry for generating clock signals in a pipeline ADC so as to avoid large PVT variations of the clock signals and thereby avoid the resulting degradation in performance of the pipeline ADC.

There also is an unmet need for improved DLL clock generation circuitry that makes more delay tap points available for use in generating clock signals while nevertheless allowing watch dog circuitry to provide necessary monitoring and control of the clock generation circuitry.

SUMMARY OF THE INVENTION

It is an object of the present invention to provide improved DLL circuitry for generating timing signals so as to avoid large PVT variations of the timing signals.

It is another object of the present invention to provide improved DLL circuitry for generating clock signals in a pipeline ADC so as to avoid large PVT variations of the clock signals and the resulting reduction in performance of the pipeline ADC.

It is another object of the present invention to provide a circuit and technique for reducing the effects of noise injected into the substrate of an integrated circuit chip.

There also is an unmet need for improved DLL clock generation circuitry that makes more delay tap points available for use in generating clock signals while nevertheless allowing watch dog circuitry to provide necessary monitoring and control of the clock generation circuitry.

Briefly described, and in accordance with one embodiment, the present invention provides a delay locked loop clock generation circuit including a delay locked loop circuit (18), a dummy delay line (40), and a watch dog circuit (32). The delay locked loop circuit (18) includes a delay line (20) including a plurality of sequentially connected delay stages (21-1,2 . . . N), a first delay stage (21-1) connected to receive a first clock signal (CLK), each of the delay stages having a delay control input connected to receive a control signal (Vctrl), various tap points of the delay line (20) being coupled to inputs of a clock logic circuit (50) which decodes various tap points signals conducted by the various tap points, respectively, in order to generate a plurality of clock signals (52). The delay locked loop circuit (18) also includes a phase detector (25) having a first input connected to receive the first clock signal (CLK), a second input connected to an output (26) of a last delay stage (21-N) of the delay line (20), and an output (27) which performs the function of providing an output pulse of width equal to the phase difference between the input signals and, thus helps in determining whether the delay line has delay equal to the clock period (in which case phase difference is equal to zero). The delay locked loop circuit (18) further includes a charge pump circuit (30) having an input connected to the output (27) of the phase detector and an output (23) producing the control signal (Vctrl) to perform the function of converting the pulse widths at the output of the phase detector to a voltage (Vctrl), wherein the higher the voltage (Vctrl), the higher is the delay in the delay cells and delay stage. The dummy delay line (40) includes a delay line (20) including a plurality of sequentially connected delay stages (21-1,2 . . . N) that are precisely matched to the delay stages of the delay line (20). A first delay stage (21-1) of the dummy delay line (40) is connected to receive a second clock signal (CLKZ) which is out of phase with respect to the first clock signal (CLK), each of the delay stages of the dummy delay line having a delay control input connected to receive the control signal (Vctrl). The watchdog circuit (32) has a plurality of inputs coupled to various tap points of the dummy delay line (40) to generate a first group of control signals (34A) coupled to the phase detector (25) and a second group of control signals (34B) coupled to the charge pump circuit (30)

In one embodiment, the DLL clock generation circuitry is used to provide sample and hold clock signals which are relatively independent of the PVT variations as clock signals for a pipeline ADC.

In accordance with another embodiment, the invention provides a pipeline ADC including a sample and hold amplifier that samples an input to the pipeline ADC followed by a first pipeline stage of the pipeline ADC, wherein each of a plurality of pipeline stages samples the previous pipeline stage during a sample clock phase and produces a residue signal through a gain amplifier of the pipeline stage during a hold clock phase, and also including a delay locked loop clock generation circuit (100). The delay locked loop clock generation circuit (100) includes a delay locked loop circuit (18) including a delay line (20) having a plurality of serially connected delay stages (21-1,2 . . . N), a first delay stage (21-1) being connected to receive a first clock signal (CLK), each of the delay stages having a delay control input connected to receive a delay control signal (Vctrl), various tap points of the delay line (20) being coupled to inputs of a clock logic circuit (50) operating on various tap point signals conducted by the various tap points, respectively, to generate a plurality of clock signals (52), a phase detector (25) having a first input connected to receive the first clock signal (CLK), a second input connected to an output of a final delay stage (21-N) of the delay line (20), and an output (27), a charge pump circuit (30) having an input connected to the output (27) of the phase detector and an output (23) producing the delay control signal (Vctrl).

DETAILED DESCRIPTION OF THE PREFERRED EMBODIMENTS

Figure 1:
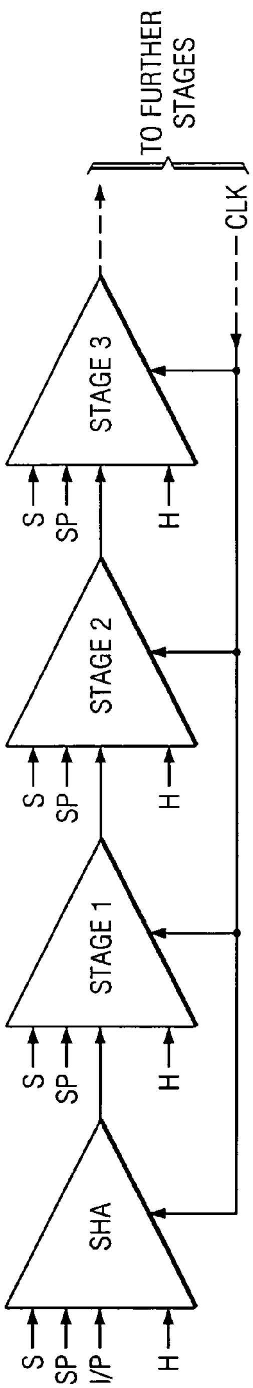
FIG. 1 is a diagram of a prior art pipeline ADC including conventional DLL clock generation circuitry.
Figure 3:
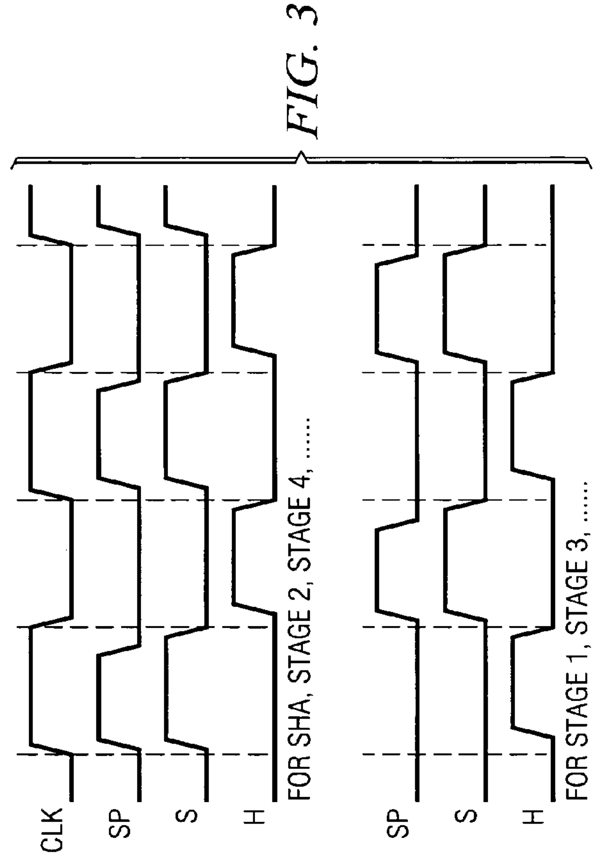
FIG. 3 is a timing diagram useful explaining the operation and shortcomings of the pipeline ADC of FIG. 1 and the conventional DLL clock generation circuitry therein.
Figure 2:
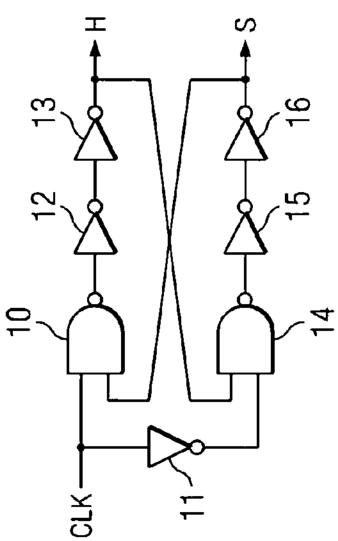
FIG. 2 is a block diagram of a conventional clock generation circuit for the pipeline ADC shown in FIG. 1.
Figure 4:
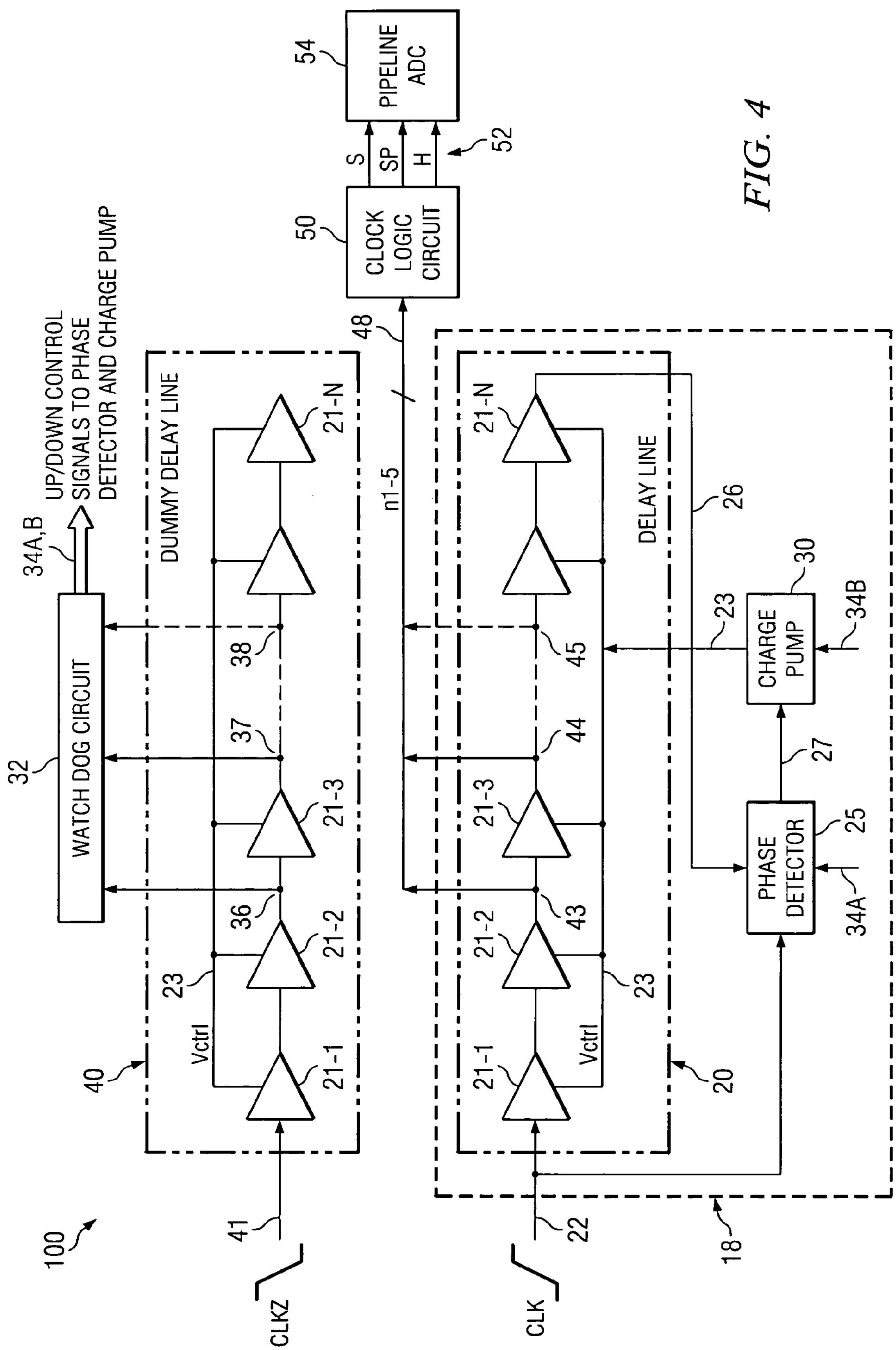
FIG. 4 is a block diagram of the improved DLL clock generation circuitry according to the present invention, adapted for use in a pipeline ADC.

Referring to FIG. 4, clock generation circuit 100 includes a delay locked loop or DLL circuit 18 which includes a delay line 20, a phase detector 25, a charge pump 30, and a clock logic circuit 50. Delay line 20 includes N sequentially connected conventional delay stages 21-1,2 . . . N. The input of delay stage 21-1 is connected to conductor 22 on which a clock signal CLK is conducted. The output of delay stage 21-1 is connected to the input of delay stage 21-2, the output of which is connected to the input of delay stage 21-3, and so forth. The output of the last delay stage 21-N is connected by conductor 26 to one input of phase detector 25. The output of each of delay stages 21-1,2 . . . N can be considered to be a tap point that conducts a tap point signal which is delayed version of CLK. Various tap points signals are provided as inputs to clock logic circuitry 50 that generates clock signals for other circuitry, such as a pipeline ADC 54 formed on the same integrated circuit chip as clock generation circuit 100. Clock logic circuit 50 receives various tap point signals 48 (shown in more detail in FIGS. 5 and 6) as inputs and operates on them to generate clock signals such as sample signals S and SP and hold signals H and HP, which can be used to clock the two-stage Miller-compensated amplifiers in gain stages of a pipeline ADC.

Another input of phase detector 25 is connected to CLK. Phase detector 25 also receives a control signal 34A generated by watch dog circuit 32, as subsequently explained. The output of phase detector 25 is connected by conductor 27 to an input of a charge pump circuit 30. Another input of charge pump circuit 30 is connected to receive control signal 34B generated by watchdog circuit 32. Charge pump circuit 30 generates a delay control signal Vctrl on conductor 23, which is connected to the delay control input of each of delay stages 21-1,2 . . . N. The first and second control signals 34A and 34B are a “harmonic lock detect” signal and a "stuck state detect" signal, respectively (also called "DOWN" signals and"UP" signals, respectively). A "harmonic lock state" occurs if the DLL tries to lock to a delay that is greater than the period T of CLK, for example 2T, 3T or 4T etc. This is because phase detector 25 cannot differentiate between T, 2T or 3T, which is because for phase detector 25 all such delays represent a phase difference of zero. Similarly, phase detector 25 cannot differentiate between zero and t and might try to lock a zero delay, thus causing a stuck state. If watch dog circuit 32 detects either of these conditions, it will pull Vctrl UP in case of a stuck state or DOWN in case of a harmonic lock the so that the DLL 18 comes out of the condition.

Note that delay stages 21-1,2 etc., phase detector 25, charge pump circuit 30 and watchdog circuit 32 all are conventional circuits which are commonly utilized in typical DLL circuits for generating non-overlapping clock signals.

Still referring to FIG. 4, dummy delay line 40 is essentially identical to delay line 20, and also includes N delay stages 21-1,2 . . . N. The first delay stage 20-1 of dummy delay line 40 receives a dummy clock signal CLKZ which is inverted or out of phase with respect to CLK. The delay control input of each of delay stages 21-1,2 . . . N of dummy delay line 40 also is connected to conductor 23 to receive Vctrl. Various tap points, such as 36, 37, and 38, of dummy delay line 40 are connected to inputs of watchdog circuit 32. Note that no structural change is required in the prior art pipeline ADC circuitry to be adapted for use with the clock generation circuit 100 of the present invention.

Figure 5:
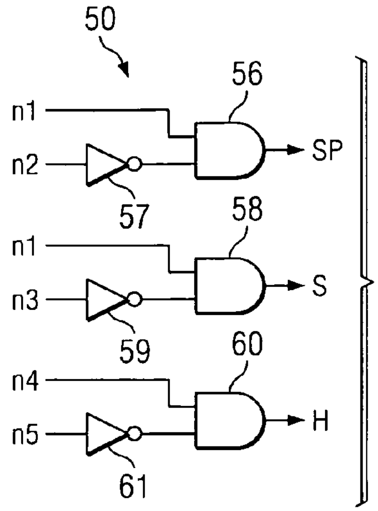
FIG. 5 is a more detailed schematic diagram of DLL clock generation circuitry of FIG. 4.

Referring to FIG. 5, clock logic circuit 50 includes an AND circuit 56 having an input which receives one of the tap point signals n1 of delay line 20 circuit and another input which receive the output of an inverter 57. Inverter 57 has an input coupled to receive another tap point signal n2. The output of AND circuit 56 produces sampling signal SP. Similarly, clock logic circuit 50 includes an AND circuit 58 having an input which receives tap point signal n1 and another input which receive the output of an inverter 59. Inverter 59 has an input coupled to receive another tap point signal n3. The output of AND circuit 58 produces sampling signal S. Clock logic circuit 50 also includes an AND circuit 60 having an input which receives tap point signal n4 and another input which receive the output of an inverter 61. Inverter 61 has an input coupled to receive another tap point signal n5. The output of AND circuit 60 produces hold signal H. Tap point signals n1,2 . . . 5 are shown in a timing diagram of FIG. 6, as are the resulting clock signals SP, S and H. The above mentioned clock signal HP can be generated similarly.

Figure 7:
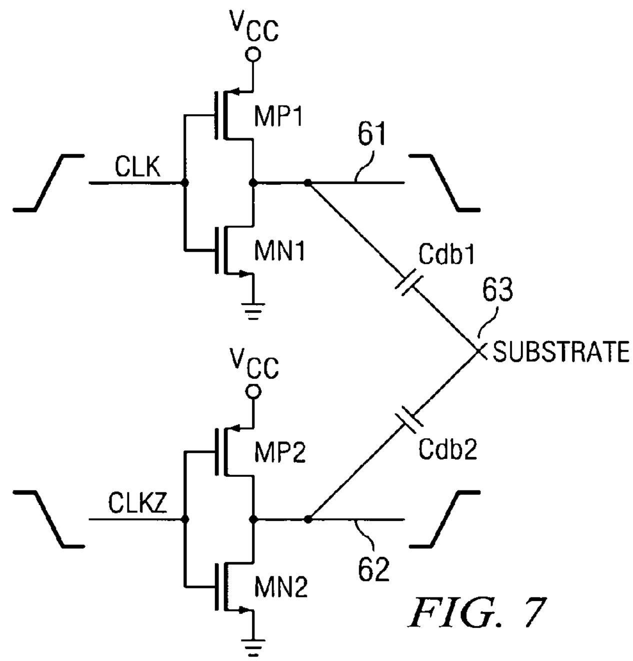
FIG. 7 is a schematic diagram illustrating corresponding, adjacent delay elements of the delay line and dummy delay line of FIG. 4.

Referring to FIG. 7, a schematic diagram is shown including one delay element MP1,MN1 of delay line 20 and an immediately adjacent corresponding delay element MP2, MN2 of dummy delay line 40. The inverting delay elements MP1,MN1 and MP2,MN2 shown in FIG. 7 may inject large amounts of substrate noise through the parasitic drain-to-bulk capacitances Cdb1 and Cdb2, respectively. By keeping the delay elements of actual delay line 20 and the delay elements of dummy delay line 40 close together and operating them in response to opposite clock phases CLK and CLKZ, the substrate noise injected into the substrate 63 (FIG. 7) is substantially canceled, to the extent of the matching between parasitic drain-to-bulk capacitances Cdb1 and Cdb2 of the two inverting delay elements.

Figure 6:
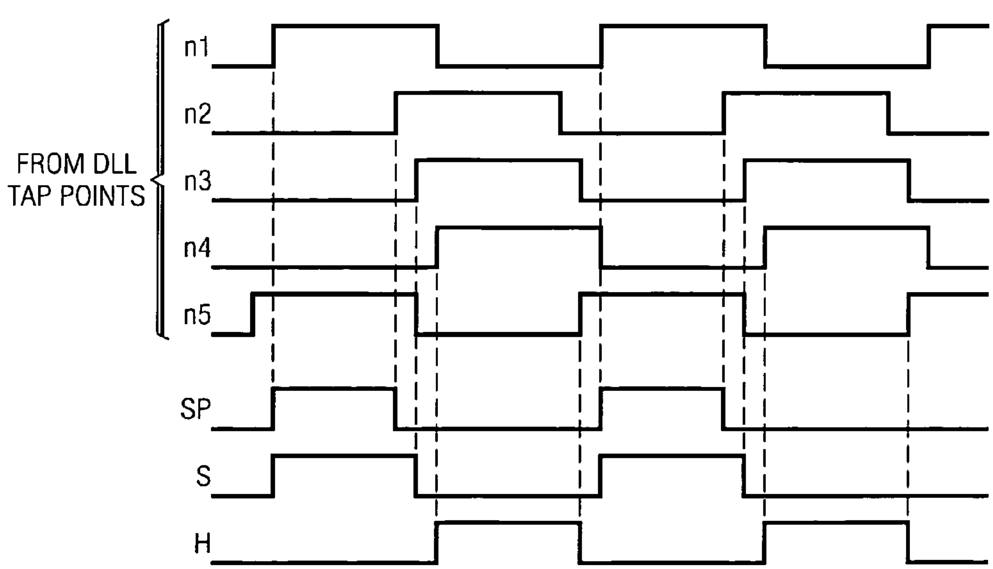
FIG. 6 is a timing diagram that shows the clock signals and various important circuit node signals that are necessary to the understanding of the operation of the DLL clock generation circuitry of FIGS. 4 and 5.

For example, during a positive transition of CLK, transistor MP1 turns off and transistor MN1 turns on, and the coupling of parasitic drain-to-bulk capacitance Cdb1 causes flow of a noise current out of substrate 63 through transistor MN1 into the ground conductor connected to the source of transistor MN1. However, the resulting noise in substrate 63 is at least partially canceled because CLKZ essentially simultaneously turns transistor MN2 off and simultaneously turns transistor MP2 on, and the coupling of a matched parasitic drain-to-bulk capacitance Cdb2 causes flow of an opposite-polarity matched noise current from VCC through transistor M2 into substrate 63. In the prior art schemes, the edges of signals such as n1 to n5 are generated by delays, so by designing in the fastest "process corner" for non-overlap, in the slowest process corner, the non-overlap becomes 2–3 times higher for crunching the sample and hold times. (The term "process corner" means a silicon process statistical variation which can make components faster, e.g., a silicon process statistical variation which can increase the transconductance of a transistor. The term "crunching" means a reduction in an effective time for sampling data in the sample phase or settling of the amplifier in the hold phase which would potentially degrade performance.) In the present scheme, since the signals n1 to n5 of FIG. 6 are generated by DLL edges that have a definite phase relationship irrespective of the "process corner", the clock generator circuit 50 shown in FIG. 5 can be designed for the minimum non-overlap time required, and this will provide a large amount of extra sample and hold time because the non-overlap time remains the same (i.e., minimum) in the slowest process corner also.

Furthermore, use of dummy delay line 40 also keeps all delay tap points of delay line 20 free to be used by other circuits. Locating dummy delay line 40 very close to delay line 20 and feeding it the out-of-phase clock signal CLKZ causes effective switching noise cancellation. The described DLL-based clocking results in a low PVT variation of the generated clock signals 52, which in turn ensures optimum hold and sample time for switched-capacitance amplifiers and ensures constant non-overlapping times for all of the clock signals.

Thus, use of the above described dummy delay line 40 located in close proximity with (i.e., immediately adjacent to) delay line 20 and operating on the inverted clock signal CLKZ but having the same delay control voltage Vctrl to a large extent cancels the switching noise. The delay line layout is made in such a way that one delay stage constitutes two delay cells, one cell for the actual line and the other for the dummy line, positioned close to one another and therefore closely matched. These delay stages are cascaded to form the delay line. Dummy delay line 40, which has essentially the same delay as the actual delay line (except for mismatches), is tapped by watchdog circuit 32 to ensure proper working of the DLL circuit 18 without being connected to additional tap points of delay line 20. Use of successive DLL tap point signal edges for generating non-overlapping clock phase signals 52 for pipeline ADC 54 eliminates the above mentioned PVT variation in clocking signals of the prior art DLL clock generation circuits.

Thus, the invention includes (1) improving pipeline ADC clocking by using a DLL to generate the clocks. The invention also includes improving a DLL design by using a dummy line along with the actual line. The invention is particularly useful whenever the timing of the edges of clock signals is critical. It should be understood that a DLL basically takes an input clock and generates equidistant edges between two consecutive rising/falling edges of the input clock. These equidistant edges are PVT invariant because a feedback loop corrects for any PVT variation. If two consecutive edges are chosen, for example a falling edge of a signal SAMPLEP and a signal SAMPLE, the phase relationship would remain the same, whatever the process corner may be. Therefore, the closest possible edges can be chosen, thereby increasing the effective sample and hold times. In conventional schemes, since SAMPLEP and SAMPLE are generated from buffer delays, this would be PVT variant (i.e., dependent upon PVT). So to avoid overlapping of the signals SAMPLEP and SAMPLE, it is necessary to provide a margin of safety for the fastest "process corner" (where buffer delay is minimum), so that for the weakest "process corner", corresponding edges of the signals SAMPLEP and SAMPLE would be spaced apart by an interval equal to approximately 3 times the margin of safety, thereby "crunching" sample and hold times. This is very critical in speed designs where buffer delays are a large fraction (e.g., 5 percent) of sample/hold times.

As shown in FIG. 4, delay locked loop clock generation circuit 100 is coupled to a pipeline ADC 54 on the same chip to reduce PVT variations on performance of the pipeline ADC. The switching current injected into the substrate by the delay line and dummy delay line during an instant is in the opposite direction, so the net switching current is much lower. Since this switching takes place throughout the clock period, it could corrupt the SHA sampling and ADC sampling instant resulting in SNR degradation.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A delay locked loop clock generation circuit comprising:

(a) a delay locked loop circuit including i. a delay line including a plurality of serially connected delay stages, a first delay stage being connected to receive a first clock signal, each of the delay stages having a delay control input connected to receive a delay control signal, various tap points of the delay line being coupled to inputs of a clock logic circuit operating on various tap point signals conducted by the various tap points, respectively, to generate a plurality of clock signals, ii. a phase detector having a first input connected to receive the first clock signal, a second input connected to an output of a final delay stage of the delay line, and an output, and iii. a delay control circuit having an input connected to the output of the phase detector and an output producing the delay control signal;

(b) a dummy delay line including a delay line including a plurality of serially connected dummy delay stages that are matched to corresponding delay stages of the delay line, respectively, a first dummy delay stage being connected to receive a second clock signal which is inverted with respect to the first clock signal, each of the dummy delay stages having a delay control input connected to receive the delay control signal; and (c) a watchdog circuit having a plurality of inputs coupled to various tap points of the dummy delay line to generate a first control signal coupled to the phase detector and a second control signal coupled to the delay control circuit, wherein corresponding delay stages and dummy delay stages are located physically close to each other in a substrate of an integrated circuit chip and co-act to cancel noise injected into the substrate as a result of switching of the delay stages.

2. The delay locked loop clock generation circuit of claim 1 wherein the delay control circuit includes a charge pump circuit.

3. The delay locked loop clock generation circuit of claim 1 wherein each delay stage includes an inverting circuit including a P-channel transistor and an N-channel transistor having their gates connected to receive the first clock signal and having their drains coupled together to an output of the delay stage and also coupled by a first parasitic capacitance to a substrate of an integrated circuit in which the delay locked loop clock generation circuit is formed, and wherein each corresponding dummy delay stage includes an inverting circuit including a P-channel transistor and an N-channel transistor having their gates connected to receive the second clock signal and having their drains coupled together to an output of the dummy delay stage and also coupled by a second parasitic capacitance to the substrate, wherein during a transition of the first clock signal a noise current coupled between the output of the delay stage and the substrate is of a polarity opposite to a polarity of a noise current coupled between the output of the dummy delay stage and the substrate in response to a corresponding transition of the second clock signal.

4. The delay locked loop clock generation circuit of claim 3 wherein the first and second parasitic capacitances are matched and wherein the corresponding delay stages and dummy delay stages are matched to cause the magnitudes of the opposite polarity noise currents produced by each pair of a delay stage and corresponding dummy delay stage to be equal so as to cause the opposite polarity noise current to cancel.

5. The delay locked loop clock generation circuit of claim 1 wherein the clock logic circuit includes a plurality of individual logic circuits for generating the plurality of clock signals, respectively, each individual logic circuit including a logical ANDing circuit having a first input coupled to one of the tap points of the delay line and a second input coupled to an output of an inverter having an input coupled to another tap point of the delay line.

6. The delay locked loop clock generation circuit of claim 1 wherein the first control signal is a harmonic lock detect signal and the second control signal is a stuck state detect signal.

7. A pipeline ADC comprising:

(a) a sample and hold amplifier that samples an input to the pipeline ADC followed by a first pipeline stage of the pipeline ADC, wherein each of a plurality of pipeline stages samples the previous pipeline stage during a sample clock phase and produces a residue signal through a gain amplifier of the pipeline stage during a hold clock phase;

(b) a delay locked loop clock generation circuit including i. a delay locked loop circuit including a delay line including a plurality of serially connected delay stages, a first delay stage being connected to receive a first clock signal, each of the delay stages having a delay control input connected to receive a delay control signal, various tap points of the delay line being coupled to inputs of a clock logic circuit operating on various tap point signals conducted by the various tap points, respectively, to generate a plurality of clock signals, a phase detector having a first input connected to receive the first clock signal, a second input connected to an output of a final delay stage of the delay line, and an output, a charge pump circuit having an input connected to the output of the phase detector and an output producing the delay control signal;

(c) a dummy delay line including a delay line; and (d) a watchdog circuit having a plurality of inputs coupled to tap points of the dummy delay line.

8. A pipeline ADC comprising:

(a) a sample and hold amplifier that samples an input to the pipeline ADC followed by a first pipeline stage of the pipeline ADC, wherein each of a plurality of pipeline stages samples the previous pipeline stage during a sample clock phase and produces a residue signal through a gain amplifier of the pipeline stage during a hold clock phase;

(b) a delay locked loop clock generation circuit including (1) a delay locked loop circuit including i. a delay line including a plurality of serially connected delay stages, a first delay stage being connected to receive a first clock signal, each of the delay stages having a delay control input connected to receive a delay control signal, various tap points of the delay line being coupled to inputs of a clock logic circuit operating on various tap point signals conducted by the various tap points, respectively, to generate a plurality of clock signals, ii. a phase detector having a first input connected to receive the first clock signal, a second input connected to an output of a final delay stage of the delay line, and an output, and iii. a charge pump circuit having an input connected to the output of the phase detector and an output producing the delay control signal;

(2) a dummy delay line including a delay line including a plurality of serially connected to dummy delay stages that are matched to corresponding delay stages of the delay line, a first dummy delay stage being connected to receive a second clock signal which is inverted with respect to the first clock signal, each of the dummy delay stages having a delay control input connected to receive the delay control signal; and (3) a watchdog circuit having a plurality of inputs coupled to various tap points of the dummy delay line to generate a first control signal coupled to the phase detector and a second control signal coupled to the charge pump circuit, wherein corresponding delay stages and dummy delay stages are located physically close to each other in a substrate of an integrated circuit chip and co-act to cancel noise injected into the substrate as a result of switching of the delay stages.

9. The pipeline ADC of claim 8 wherein each delay stage includes an inverting circuit including a P-channel transistor and an N-channel transistor having their gates connected to receive the first clock signal and having their drains coupled together to an output of the delay stage and also coupled by a first parasitic capacitance to a substrate of an integrated circuit in which the delay locked loop clock generation circuit is formed, and wherein each corresponding dummy delay stage includes an inverting circuit including a P-channel transistor and an N-channel transistor having their gates connected to receive the second clock signal and having their drains coupled together to an output of the dummy delay stage and also coupled by a second parasitic capacitance to the substrate, wherein during a transition of the first clock signal a noise current coupled between the output of the delay stage and the substrate is of a polarity opposite to a polarity of a noise current coupled between the output of the dummy delay stage and the substrate in response to a corresponding transition of the second clock signal.

10. The delay locked loop clock generation circuit of claim 9 wherein the first and second parasitic capacitances are matched and wherein the corresponding delay stages and dummy delay stages are matched to cause the magnitudes of the opposite polarity noise currents produced by each pair of a delay stage and corresponding dummy delay stage to be equal so as to cause the opposite polarity noise current to cancel.

11. The delay locked loop clock generation circuit of claim 8 wherein the clock logic circuit includes a plurality of individual logic circuits for generating the plurality of clock signals, respectively, each individual logic circuit including a logical ANDing circuit having a first input coupled to one of the tap points of the delay line and a second input coupled to an output of an inverter having an input coupled to another tap point of the delay line.

12. The delay locked loop clock generation circuit of claim 8 wherein the first control signal is a harmonic lock detect signal and the second control signal is a stuck state detect signal.

13. A method of reducing substrate noise in a delay locked loop circuit, comprising:

(a) providing a delay locked loop circuit including i. a delay line including a plurality of serially connected delay stages, a first delay stage being the state connected to receive a first clock signal, each of the delay stages having a delay control input connected to receive a delay control signal, various tap points of the delay line being coupled to inputs of a clock logic circuit operating on various tap point signals conducted by the various tap points, respectively, to generate a plurality of clock signals, ii. a phase detector having a first input connected to receive the first clock signal, a second input connected to an output of a final delay stage of the delay line, and an output, and iii. a delay control circuit having an input connected to the output of the phase detector and an output producing the delay control signal, wherein switching of the delay stages causes parasitic coupling of noise between outputs of the delay stages and a substrate of an integrated circuit in which the delay locked loop circuit is formed; and (b) canceling the parasiticly coupled noise by synchronously coupling opposite-polarity noise into the substrate, including performing step (b) by providing a dummy delay line including a delay line including a plurality of serially connected dummy delay stages that are matched to corresponding delay stages of the delay line, respectively, a first dummy delay stage being connected to receive a second clock signal which is inverted with respect to the first clock signal, each of the dummy delay stages having a delay control input connected to receive the delay control signal such that corresponding delay stages and dummy stages are located physically close to each other in the substrate.

14. The method of claim 13 including generating the delay control signal by means of a charge pump circuit.

15. The method of claim 13 including controlling the phase detector in response to a harmonic lock detect signal produced by a watchdog circuit having a plurality of inputs coupled to various tap points of the dummy delay line, and controlling the delay control circuit in response to a stuck state signal produced by the watchdog circuit.

16. A method of reducing substrate noise in a pipeline ADC, comprising:

(a) providing a sample and hold amplifier that samples an input to the pipeline ADC followed by a first pipeline stage of the pipeline ADC, wherein each of a plurality of pipeline stages samples the previous pipeline stage during a sample clock phase and produces a residue signal through a gain amplifier of the pipeline stage during a hold clock phase;

(b) providing a delay locked loop circuit including i. a delay line including a plurality of serially connected delay stages, a first delay stage being the state connected to receive a first clock signal, each of the delay stages having a delay control input connected to receive a delay control signal, various tap points of the delay line being coupled to inputs of a clock logic circuit operating on various tap point signals conducted by the various tap points, respectively, to generate a plurality of clock signals, ii. a phase detector having a first input connected to receive the first clock signal, a second input connected to an output of a final delay stage of the delay line, and an output, and iii. a delay control circuit having an input connected to the output of the phase detector and an output producing the delay control signal, wherein switching of the delay stages causes parasitic coupling of noise between outputs of the delay stages and a substrate of an integrated circuit in which the delay locked loop circuit is formed; and (c) canceling the parasiticly coupled noise by synchronously coupling opposite-polarity noise into the substrate, including performing step (c) by providing a dummy delay line including a delay line including a plurality of serially connected dummy delay stages that are matched to corresponding delay stages of the delay line, respectively, a first dummy delay stage being connected to receive a second clock signal which is inverted with respect to the first clock signal, each of the dummy delay stages having a delay control input connected to receive the delay control signal such that corresponding delay stages and dummy stages are located physically close to each other in the substrate.

17. The method of claim 16 including controlling the phase detector in response to a harmonic lock detect signal produced by a watchdog circuit having a plurality of inputs coupled to various tap points of the dummy delay line, and controlling the delay control circuit in response to a stuck state signal produced by the watchdog circuit.

* * * * *